(12) United States Patent
Gollier et al.

(10) Patent No.: US 7,653,097 B2
(45) Date of Patent: Jan. 26, 2010

(54) SYSTEMS AND METHODS FOR POLARIZATION MODULATION OF AN OPTICAL SIGNAL

(75) Inventors: Jacques Gollier, Painted Post, NY (US); Dmitri Vladislavovich Kuksenkov, Painted Post, NY (US); Dragan Pikula, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 176 days.

(21) Appl. No.: 12/072,426

(22) Filed: Feb. 26, 2008

(65) Prior Publication Data

US 2009/0168818 A1  Jul. 2, 2009

Related U.S. Application Data

(60) Provisional application No. 61/018,114, filed on Dec. 31, 2007.

(51) Int. Cl.
*H01S 3/10* (2006.01)
*H01S 3/13* (2006.01)

(52) U.S. Cl. ............ 372/27; 372/26; 372/29.023; 372/29.016

(58) Field of Classification Search ............ 372/26–27, 372/29.016, 29.023
See application file for complete search history.

(56) References Cited

U.S. PATENT DOCUMENTS

| 4,511,220 | A | | 4/1985 | Scully | 350/403 |
|---|---|---|---|---|---|
| 5,126,876 | A | * | 6/1992 | O'Meara | 359/338 |
| 5,233,460 | A | | 8/1993 | Partlo et al. | 359/247 |
| 5,404,224 | A | | 4/1995 | Kotidis et al. | 356/351 |

(Continued)

FOREIGN PATENT DOCUMENTS

EP  1329760  11/2002

(Continued)

OTHER PUBLICATIONS

Trisnadi, JA "Hadamard speckle contrast reduction", Optics Letters, 2004, pp. 11-13, vol. 29.

(Continued)

*Primary Examiner*—Minsun Harvey
*Assistant Examiner*—Phillip Nguyen
(74) *Attorney, Agent, or Firm*—Gregory V. Bean

(57) ABSTRACT

According to one embodiment of the present invention, a method of operating a laser source is provided. The laser source comprises a laser configured to generate an optical signal, and a polarization split and delay unit that is coupled to the optical signal. The polarization split and delay unit is configured to split the optical signal into a first and second orthogonally polarized component, create an optical path difference $\Delta L$ between the first and second orthogonally polarized components and combine the first and second orthogonally polarized components into a combined signal. The method comprises modulating the optical signal by applying a wavelength modulation signal to the laser such that the modulated optical signal comprises at least a first wavelength $\lambda_1$ and a second wavelength $\lambda_2$, wherein the first wavelength $\lambda_1$ and the second wavelength $\lambda_2$ are separated by a wavelength difference $\Delta\lambda$. The wavelength difference $\Delta\lambda$ and the optical path difference $\Delta L$ are such that the first and second orthogonally polarized components oscillate back and forth from an in-phase state to an out of phase state. Additional embodiments are also disclosed and claimed.

25 Claims, 2 Drawing Sheets

U.S. PATENT DOCUMENTS

| | | | |
|---|---|---|---|
| 5,589,936 A | 12/1996 | Uchikawa et al. | 356/345 |
| 6,011,643 A | 1/2000 | Wunderlich et al. | 359/279 |
| 6,160,665 A * | 12/2000 | Yuan | 359/629 |
| 6,191,887 B1 * | 2/2001 | Michaloski et al. | 359/495 |
| 6,323,984 B1 | 11/2001 | Trisnadi | 359/245 |
| 6,331,910 B1 * | 12/2001 | Dultz et al. | 359/246 |
| 6,574,015 B1 | 6/2003 | Tselikov et al. | 359/111 |
| 6,577,429 B1 | 6/2003 | Kurtz et al. | 359/279 |
| 6,600,590 B2 | 7/2003 | Roddy et al. | 359/287 |
| 6,693,743 B2 * | 2/2004 | Zhao | 359/495 |
| 6,897,992 B2 | 5/2005 | Kikuchi | 359/237 |
| 6,956,878 B1 | 10/2005 | Trisnadi | 372/27 |
| 7,030,383 B2 | 4/2006 | Babayoff et al. | 250/370.08 |
| 7,119,936 B2 | 10/2006 | Kowarz et al. | 359/224 |
| 7,136,159 B2 | 11/2006 | Tsai et al. | 356/237.5 |
| 7,166,017 B2 | 1/2007 | Minamihaba et al. | 451/36 |
| 7,171,129 B1 | 1/2007 | Blair et al. | 398/203 |
| 7,187,500 B2 | 3/2007 | Chuang et al. | 359/618 |
| 7,193,765 B2 | 3/2007 | Christensen et al. | 359/279 |
| 7,214,946 B2 | 5/2007 | Babayoff et al. | 250/370.08 |
| 7,244,028 B2 | 7/2007 | Govorkov et al. | 353/37 |
| 7,508,852 B2 * | 3/2009 | Arahira | 372/26 |
| 2002/0118422 A1 * | 8/2002 | Cao | 359/161 |
| 2002/0164123 A1 | 11/2002 | Hmerly et al. | 385/39 |
| 2002/0180869 A1 | 12/2002 | Callison et al. | 348/203 |
| 2003/0012239 A1 | 1/2003 | Daniber et al. | 372/38.01 |
| 2004/0165621 A1 | 8/2004 | Chuang et al. | 372/25 |
| 2006/0012842 A1 | 1/2006 | Abu-Ageel | 359/193 |
| 2006/0018025 A1 | 1/2006 | Sharon et al. | 359/618 |
| 2006/0023165 A1 | 2/2006 | Ishihara et al. | 353/20 |
| 2006/0092515 A1 | 5/2006 | Kim et al. | 359/566 |
| 2006/0146896 A1 | 7/2006 | Park | 372/29.023 |
| 2006/0221429 A1 * | 10/2006 | Christensen et al. | 359/279 |
| 2007/0008519 A1 | 1/2007 | Naftali et al. | 356/237.2 |
| 2007/0058135 A1 | 3/2007 | Morikawa et al. | 353/30 |
| 2007/0086492 A1 | 4/2007 | Betin et al. | 372/9 |
| 2007/0133630 A1 | 6/2007 | Ha | 372/26 |
| 2007/0188716 A1 | 8/2007 | Hashimoto | 353/30 |
| 2007/0223091 A1 | 9/2007 | Lee | 359/494 |

FOREIGN PATENT DOCUMENTS

| | | |
|---|---|---|
| EP | 1260850 | 11/2005 |
| EP | 1734771 | 12/2006 |

OTHER PUBLICATIONS

Goodman, JW Speckle Phenomena in Optics: Theory and Applications, 2007 Roberts & Co. Englewood, CO pp. 203-228.

* cited by examiner

SYSTEMS AND METHODS FOR POLARIZATION MODULATION OF AN OPTICAL SIGNAL

CROSS-REFERENCE TO RELATED APPLICATIONS

This application claims the benefit of U.S. Provisional Patent Application Ser. No. 61/018,114, filed Dec. 31, 2007.

BACKGROUND OF THE INVENTION

The present invention relates to systems and methods for polarization modulation of an optical signal. More specifically, the present invention relates to the design and methods of operation of a laser source and laser projection system to reduce the presence of speckle that may be visible in a laser projection image. Speckle may result whenever a coherent light source is used to illuminate a rough surface, for example, a screen, or any other object that produces a diffused reflection or transmission.

Particularly, a multitude of small areas of the screen or other reflecting object scatter light into a multitude of reflected beams with different points of origination and different propagation directions. At an observation point, for example in the observer's eye or at the sensor of a camera, these beams interfere constructively to form a bright spot, or destructively to form a dark spot, producing a random granular intensity pattern known as speckle. Speckle may be characterized by the grain size and contrast, usually defined as a ratio of standard deviation to mean light intensity in the observation plane. For a large enough illuminated area and a small enough individual scattering point size, the speckle will be "fully developed," with a brightness standard deviation of 100%. As an example and not a limitation, if an image is formed on a surface screen using laser beams, such granular structure will represent noise, or a serious degradation of the image quality.

BRIEF SUMMARY OF THE INVENTION

According to one embodiment of the present invention, a method of operating a laser source is provided. The laser source comprises a laser configured to generate an optical signal, and a polarization split and delay unit that is coupled to the optical signal. The polarization split and delay unit is configured to split the optical signal into a first and second component having orthogonal polarization, create an optical path difference $\Delta L$ between the first and second components and combine the first and second components into a combined signal. The method comprises modulating the optical signal by applying a wavelength modulation signal to the laser such that the modulated optical signal comprises at least a first wavelength $\lambda_1$ and a second wavelength $\lambda_2$, wherein the first wavelength $\lambda_1$ and the second wavelength $\lambda_2$ are separated by a wavelength difference $\Delta\lambda$. The wavelength difference $\Delta\lambda$ and the optical path difference $\Delta L$ are such that the first component and the second component oscillate back and forth from an in-phase state, where the first and second components are approximately in phase (have a phase difference approximately an even integer multiple of $\pi$), to an out of phase state, where the first and second components are approximately out of phase (have a phase difference approximately an odd integer multiple of $\pi$).

According to another embodiment of the present invention, a laser projection system comprising a laser source, a laser driver and a system controller is provided. The laser source includes a laser configured to generate an optical signal and a polarization split and delay unit that is coupled to the optical signal. The system controller is programmed to modulate the optical signal by applying a wavelength modulation signal to the laser such that the modulated optical signal comprises at least a first wavelength $\lambda_1$ and a second wavelength $\lambda_2$, wherein the first wavelength $\lambda_1$ and the second wavelength $\lambda_2$ are separated by a wavelength difference $\Delta\lambda$.

BRIEF DESCRIPTION OF THE SEVERAL VIEWS OF THE DRAWINGS

The following detailed description of specific embodiments of the present invention can be best understood when read in conjunction with the following drawings, where like structure is indicated with like reference numerals and in which.

DETAILED DESCRIPTION

Figure 1:
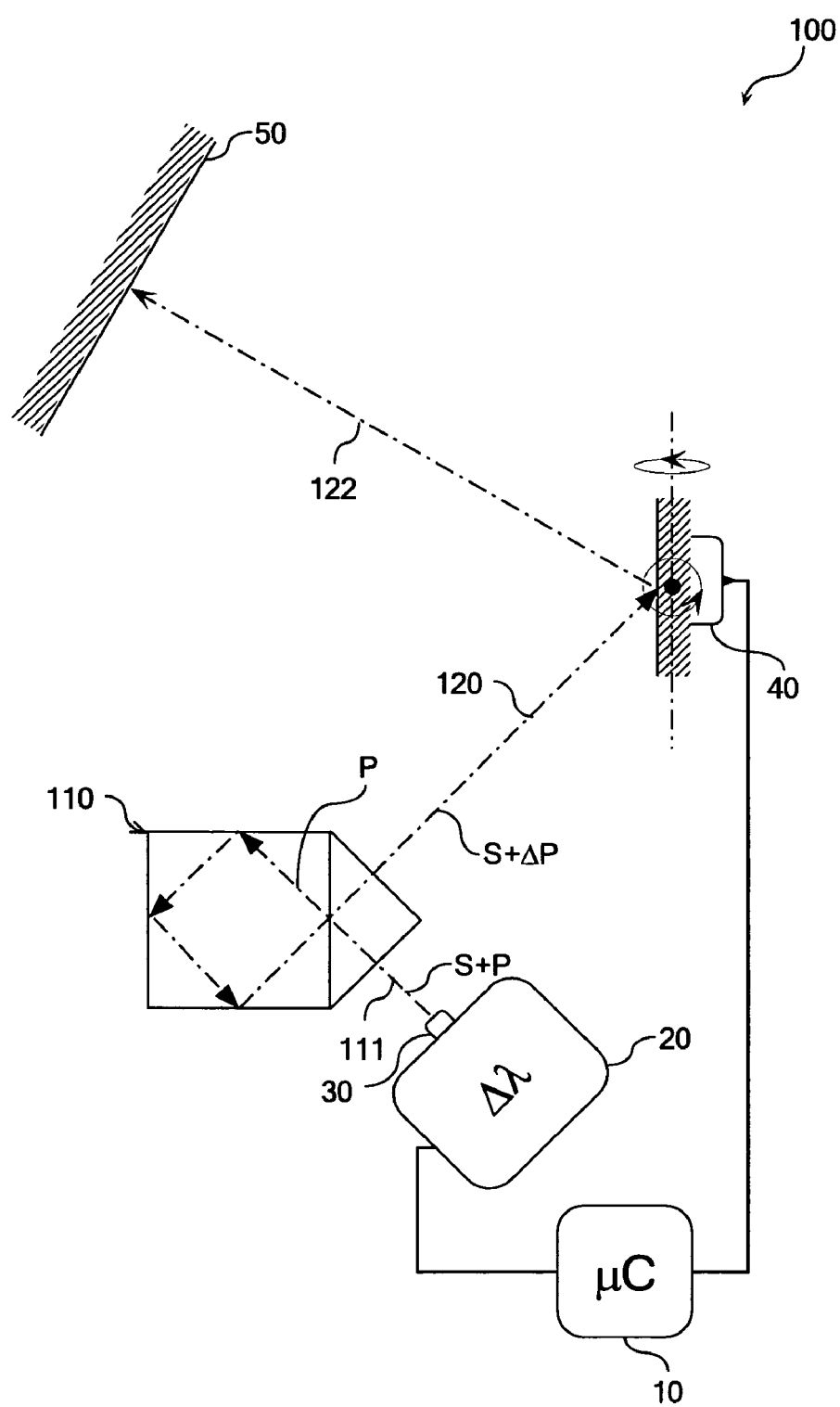
FIG. 1 is an illustration of laser projection system according to one embodiment of the present invention.

Referring initially to FIG. 1, particular embodiments of the present invention may be described in the context of a laser projection system 100 comprising a laser 30, laser driver 20, laser projection optics 40, a system controller 10 and a projected image plane 50. The system controller may control the laser driver 20 and the projection optics 40. The laser 30 may comprise semiconductor lasers, optically pumped solid state lasers, fiber lasers, or any other type of laser capable of small wavelength modulation. FIG. 1 illustrates an exemplary case where a laser projection system 100 is configured to operate as a scanning projector where the laser 30 generates one or more beams by frequency conversion, e.g., green laser beams, and/or one or more optical beams natively from semiconductor lasers, e.g., red and blue laser beams.

Although a laser scanning system is one particular application where this invention may be applied, it should be understood that the concept may also be applied to other types of laser projection system such as frame projectors, line projectors, or holographic projectors, for example. The laser projecting optics 40 for these projectors may include a one dimensional (1D) or two dimensional (2D) spatial light modulator. For example, frame projectors are projectors in which a 2D (full frame) spatial light modulator is illuminated by a laser 30, while line projectors utilize 1D (one line) spatial light modulators. Line projectors utilize a (1D) spatial light modulator to generate a line, which is then illuminated by the laser 30, magnified by a magnifying lens and scanned across a screen with a scanning mirror to create a frame of the projected image. The spatial light modulator changes the intensity of individual pixels within the frame or line between ON or OFF states, including any state therebetween (e.g., a range of reflective and transmissive states). Then, projection optics 40, which may include one or more magnifying lenses (not shown), may be used to re-image the frame on the screen 50 in case of frame projection, or scan the line image vertically in the case of line projection. When polarization insensitive spatial light modulators are used, such as digital mirror devices (DMDs) like Texas Instrument's DLP® chip, the laser polarization modulation may be directly used to decrease the speckle without affecting the quality of the image.

In other technologies, such as LCD or Liquid Crystal On Silicon (LCOS) polarization sensitive spatial light modulators, the pixels are modulated by rotating the linear polarization and using an analyzer. Because of pixel polarization, modulating the polarization of the laser 30 may destroy the image when using LCD or LCOS projectors. One solution is to switch the laser polarization between two orthogonal linear states on a frame-per-frame basis and invert the image depending on the polarization of the laser at one half of the frame generation frequency. As an example using an 8-bit modulator, if the LCD or LCOS modulator is expecting a p-polarized beam, and the laser 30 is modulated to emit an s-polarized beam for the current frame, the image is inverted by taking the absolute value of 256 minus the value of each pixel (e.g., if a pixel on the modulator has a value of 256, the inverted value of the pixel is 0).

The laser projection optics 40 may also comprise a scanning mirror in the case of a raster scanning projection image. The optical elements cooperate to generate a two-dimensional scanned laser image on a projection screen or projected image plane 50 utilizing the optical beams formed by native laser signals, or signals generated by frequency conversion. A laser 30, for example a frequency doubled semiconductor laser, may emit an optical signal 111 having a first component and a second component. For example, the first component may be an s-polarized laser beam and the second component may be a p-polarized laser beam. One of the first or second components may be delayed within the polarizing split and delay unit 110. The optical signal 111 emitted by the laser 30 may be modulated to alternate or continuously sweep between two or more wavelengths, thereby creating a wavelength difference $\Delta\lambda$. After the optical signal 111 exits the polarizing split and delay unit 110, the resulting combined signal 120 is redirected and scanned by scanning mirror 40. The scanned optical signal 122 is then directed to the projected image plane.

According to the present invention, polarization modulation may be utilized to reduce speckle without degrading beam quality in a raster scanning projection system. The present invention may also be utilized in other types of projectors, as described herein above. If the polarization of the optical signal 111 is switched or oscillated between two orthogonal polarization states rapidly (faster that the response time of the eye), then the speckle contrast may be reduced by a factor of $\sqrt{2}$. Assuming that there are no other speckle reduction features, the speckle may be determined by considering first that a fully developed speckle has a contrast close to 100%. A second aspect is that most diffusing surfaces (e.g., screens) depolarize light, and therefore two independent speckle patterns, each corresponding to the scattered light from one of the two polarization states, are emitted. As a result, without any speckle reduction feature beyond polarization, the speckle contrast is expected to be $1/\sqrt{2}$. Adding the further polarization scrambling systems and methods of the present invention can reduce speckle by an additional factor of $\sqrt{2}$ so that the final speckle contrast is about 50%. However, even a 50% contrast reduction may not be enough to cause the speckle to be unnoticeable in some applications. As such, the system and method described herein may be used in conjunction with other measures and techniques for reducing speckle, producing a compounded effect.

Generally, embodiments of the present invention split an optical signal 111, generated by a laser 30 that rapidly oscillates or switches between two output wavelengths, into two components with equal power and orthogonal polarization, delay one of the components by a predetermined amount to create an optical path length difference $\Delta L$, and combine both components to create a combined signal 120. Orthogonal polarization is not limited to light polarized at 90 degrees, or linear polarization. Polarizations are orthogonal where the two polarization states do not interfere with one another. For example, left hand and right hand circular polarizations are orthogonal polarizations. To optimally reduce speckle, as discussed herein, the optical path length difference $\Delta L$ and the wavelength difference $\Delta\lambda$ must be large enough so that the two polarization beams oscillate between in phase and in out of phase (i.e., counter) phase states so that the combined signal 120 also oscillates between two orthogonal states. In phase may be defined as the components having a phase difference of approximately an even integer multiple of $\pi$. Conversely, out of phase may be defined as the components having a phase difference of approximately an odd integer multiple of $\pi$. Without incorporating wavelength modulation, for example, the amount of delay required to exceed a coherence length may require too large of an optical path to be incorporated into a compact package. As an example and not a limitation, the spectral line width of a frequency doubled semiconductor laser is typically below 1 GHz, and therefore its coherence length is longer than 30 cm. Therefore, a glass block at least 7×7 cm in size will be required to perform a sufficient optical delay, which is not suitable for compact projectors where a semiconductor laser 30 is most likely to find its use.

Incorporating wavelength modulation as described herein drastically reduces a requisite optical path length difference $\Delta L$, enabling the use of a compact package. The present invention is very compact and achieves speckle contrast reduction without change in optical signal quality, and is therefore suitable for miniature raster scanning laser projectors. Additionally, the polarization modulation may be performed extremely fast, with a frequency comparable to or larger than the pixel rate of a scanned laser image, and is therefore compatible with other, slower speckle contrast reduction measures.

More specifically, referring to FIGS. 2-6, a polarizing split and delay unit 110 splits the incoming optical signal 111 into two components with approximately equal power and orthogonal polarization states. The polarizing split and delay unit 110 may comprise one or more polarizing beam splitters 112 that may be used to split the optical signal 111 into two beams with orthogonal polarization. One specific example of a polarizing beam splitter 112 is a Glan-Taylor prism, which typically comprises two right-angled prisms of calcite (or other similar birefringent material) that are separated on their long faces at 112 with an air gap, with the optical axes of the calcite crystals aligned parallel to the plane of reflection. The component of the incoming optical signal 111 with the electrical field vector parallel to the plane of incidence/reflection (known as p-polarization) is transmitted through the polarizing beam splitter 112, and the component with the electrical field vector perpendicular to the plane of incidence/reflection (known as s-polarization) experiences total internal reflection and is deflected at a right angle. If an optical signal 111 is polarized at 45 degrees to the plane of incidence/reflection, it will be split into an approximately equal power orthogonally polarized p and s components, one transmitted and the other reflected.

Figure 2:
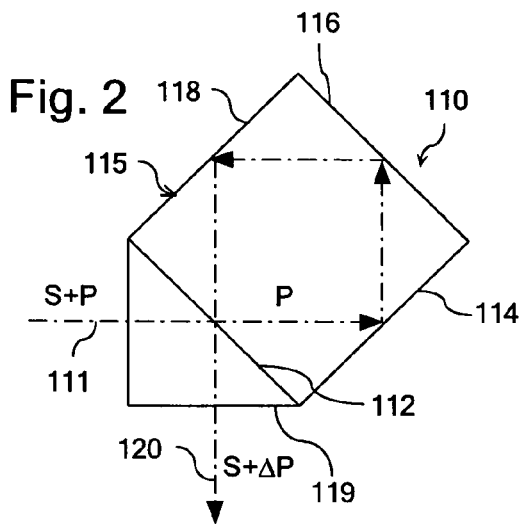
FIG. 2 is an illustration of a polarization split and delay unit according to one embodiment of the present invention.
Figure 3:
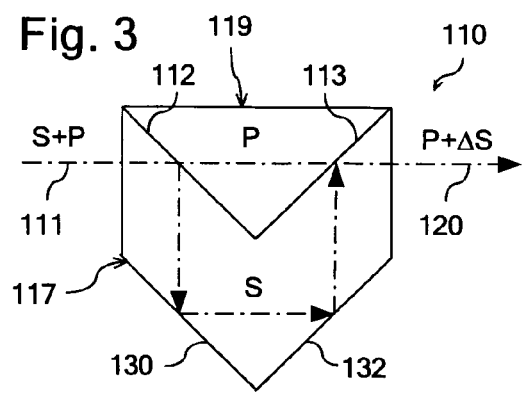
FIG. 3 is an illustration of a polarization split and delay unit according to one embodiment of the present invention.

As illustrated in FIG. 2, the polarizing split and delay unit 110 may comprise two right angle prisms 115, 119 aligned to form a beam splitting surface at 112, with one of the prisms in the shape of a cube 115. The cube prism 115 has three walls 114, 116 and 118 facing away from the polarizing beam splitter 112 coated for approximately 100% reflection of p-polarized light. As an example and not a limitation, if an incoming optical signal 111 is polarized at 45 degrees to the plane of incidence (which may be achieved by physically rotating the laser 30 or using a half-wave plate, for example), then it will be split into two equal power components at the boundary between the prisms. The s-polarized component will be reflected from the polarizing beam splitter 112 and immediately exit the polarizing split and delay unit 110. The p-polarized component will experience three reflections from the prism walls 114, 116 and 118 and then be transmitted through the beam splitter 112 and combined with the s-polarized component to form a combined signal 120. The optical path length difference ΔL between s and p components for the construction illustrated in FIG. 2 is equal to $4an\sqrt{2}$, where a is the length of a side of the cube and n is the refractive index of the material.

There is a multitude of other polarizing split and delay unit 110 constructions that will effectively split the optical signal 111 into two orthogonally polarized components as well as delay one of the components. As illustrated in the exemplary embodiment of FIG. 3, two polarizing beam splitters 112, 113 may be formed by creating two boundaries between prisms 117 and 119. The s-polarized component may be reflected by the first polarizing beam splitter 112, while the p-polarized component is transmitted through both the first polarizing beam splitter 112 and the second polarizing beam splitter 113. Two walls 130, 132 of prism 117 may be coated for approximately 100% reflection of s-polarized light, for example, thereby causing the s-polarized light to be reflected twice before reflecting off of polarizing beam splitter 113 and being recombined with the p-polarized component in the form of a combined signal 120.

Figure 4:
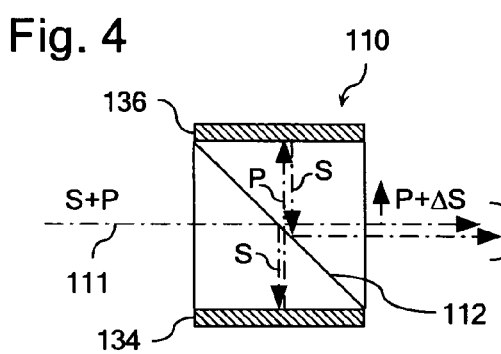
FIG. 4 is an illustration of a polarization split and delay unit according to one embodiment of the present invention.

A polarization beam splitter 112 and two parallel quarter wave plates 134 and 136 coated with approximately 100% reflective film at the outer surfaces may also be utilized as a polarizing split and delay unit 110 as illustrated in FIG. 4. In this exemplary configuration, a first component, configured as s-polarized light in this example, is reflected by the polarizing beam splitter 112 while p-polarized light is transmitted through the polarizing beam splitter 112. After the s-polarized component is reflected by the polarizing beam splitter 112, it is redirected to the first quarter wave plate 134, which changes the s-polarized component to p. The p-polarized beam is then reflected by the first quarter wave plate 134 and transmitted through the polarizing beam splitter 112 toward the second quarter wave plate 136. The second quarter wave plate 136 then changes the polarization of the first component from p to s, and then reflects the s-polarized light toward the second polarizing beam splitter 113. The second polarizing beam splitter 113 reflects the now s-polarized and combines it with the p-polarized second component. The combined signal 120 possesses a p-polarized component and a delayed s-polarized component, with the optical path length difference ΔL equal to 2an, where a is the wall of the beam splitting cube and n is the refractive index of the material.

Figure 5:
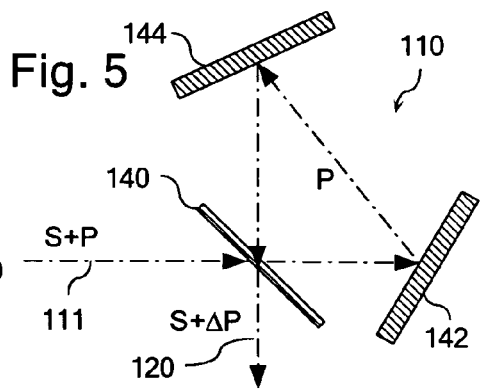
FIG. 5 is an illustration of a polarization split and delay unit according to one embodiment of the present invention.
Figure 6:
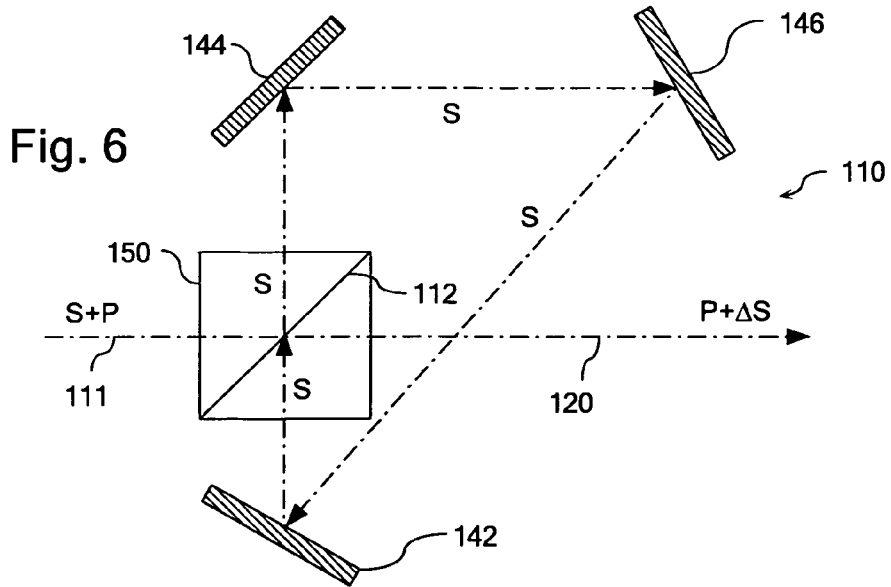
FIG. 6 is an illustration of a polarization split and delay unit according to one embodiment of the present invention.

As illustrated in FIGS. 5 and 6, a plurality of free space mirrors may redirect an orthogonally polarized component of an optical signal 111 to provide an optical path length difference ΔL. For example, in the exemplary embodiment of FIG. 5, a polarizing beam splitter 140 is configured as a polarizing mirror that transmits the p-polarized component which is then redirected by two free space mirrors 142 and 144, while the s-polarized component is reflected off of the polarizing beam splitter 140. In FIG. 6, the s-polarized component is routed around a beam splitting cube 150 by 3 free space mirrors and is then combined with the p-polarized component forming a combined signal 120. Any number of free space mirrors may be employed to achieve the desired optical path length difference ΔL. Other design choices may include routing the delayed component through a fiber-optic cable, for example.

A particular choice of a design for the polarizing split and delay unit 110 is not important for proper functioning of the present invention, so long as the polarization states of two components of the optical signal 111 are orthogonal, travel a different route before being mixed together and acquire the optical path length difference ΔL. The incoming optical signal 111 may be circularly polarized, deflection can take place at an angle different from 90 degrees, or both components can be transmitted at a different angle within a prism. Configurations where a delayed component travels within a birefringent material, as opposed to in air, have a slight advantage in size due to the refractive index of a material being typically larger than 1, and may be easier to package because the alignment of mirrors is not required.

The optical signal 111 of the laser 30 is made to rapidly oscillate with the wavelength difference Δλ, or switch between a first wavelength $\lambda_1$ and a second wavelength $\lambda_2$ that are separated by the wavelength difference Δλ such that:

$$\frac{\Delta L}{\lambda_1} = (2m-1)\frac{\lambda_1}{2\Delta\lambda}, \quad (1)$$

where m is a positive integer.

Different methods may be utilized to produce the required wavelength modulation or switching, and the method may depend on the type of laser used. For example, a laser 30 may be a frequency doubled 1060 nm diode laser producing 530 nm (green) output, and the diode laser chip may be of a three-section DBR design having a phase section, a DBR (or wavelength selective) section and a gain section. The present inventors have recognized that the output wavelength of such a DBR laser can be made to vary either continuously or in steps equal to free spectral range (longitudinal mode spacing) by applying a wavelength modulation signal in the form of a variable bias to the DBR and/or phase tuning sections while keeping the gain section bias constant. The present inventors have also recognized that, when rapidly resetting the laser gain section current to zero, DBR lasers will randomly select different longitudinal cavity modes which thereby oscillates the laser between multiple wavelengths. The wavelength modulation signal may be any type of signal, including, but not limited to square wave signals, sine wave signals and random signals such that the optical signal 111 switches between two wavelengths separated by Δλ.

The laser driver 20, which may be controlled by the system controller 10, may be configured to apply the wavelength modulation signal to the laser 30. For example, the laser driver 20 may be circuitry configured to produce the desired wavelength modulation signal. Typically, applying a high frequency AC bias to the phase section will result in a fast continuous modulation (sweeping) of the output wavelength with the amplitude dependent on the bias voltage (or current). Applying an AC bias to the DBR section will result in a laser rapidly switching between two or more discrete wavelengths corresponding to the cavity modes (a phenomenon known as mode hopping), although this behavior may be dependent on a specific chip design. For example, assuming a chip length of 3 mm, the spacing of longitudinal modes is 14.3 GHz, or 0.054 nm at 1060 nm. After frequency doubling, this corresponds to wavelength separation of 0.027 nm in green light.

In applications where frequency doubling is employed, it is important to ensure that wavelength modulation or switching does not result in a significant output power variation due to reduced frequency doubling efficiency. Typically, periodically poled lithium niobate (PPLN) crystals are used for frequency doubling of relatively low power infrared (IR) laser sources. A PPLN crystal, however, may result in reduced frequency doubling efficiency when used in conjunction with wavelength modulation. Therefore, using a shorter crystal or some version of non-uniform poling may be required to reduce the power fluctuation below an acceptable value when practicing the present invention.

As follows from equation (1), if the phase difference between the two components of the optical signal 111 caused by the delay is ϕ for the source wavelength $\lambda_1$, then it is φ+(2m−1)π for the source wavelength $\lambda_1+\lambda$. The polarization state of the combined signal 120 exiting the polarizing split and delay unit 110 for the source wavelength $\lambda$ is orthogonal to its polarization state for the source wavelength $\lambda_1+\Delta\lambda$. To illustrate this, it is assumed that for source wavelength $\lambda_1$, the s and p components of the combined signal 120 are in phase. The resulting combined signal 120 polarization will be linear with the electrical field vector oriented at +45 degrees to the incidence/reflection plane of the beam splitter. For the source wavelength $\lambda_1+\Delta\lambda$, the s and p components will acquire a phase difference of (2m−1)π, or will be out of phase. The polarization of the combined signal 120 is still linear, but with electrical field vector oriented at −45 degrees to the incidence/reflection plane. Therefore, a continuous wavelength modulation with the amplitude of $\Delta\lambda$, or the switching between two discrete wavelengths with a spacing of $\Delta\lambda$, will result in a modulation of the polarization between two orthogonal states. If such a combined signal 120 is used to project an image on a screen, for example, speckle contrast will be reduced by 30 to 50% with respect to the unchanging polarization case.

When incorporating wavelength modulation, the polarizing split and delay unit 110 may be very small in size and therefore suitable for incorporation in a miniature projector, for example. As an example and not a limitation, consider a semiconductor DBR laser with $\Delta\lambda_1=0.027$ nm after frequency doubling. From equation (1), and assuming m=1 and n=1.5, an optical path length difference $\Delta L$ of 5.2 mm is obtained. For the polarizing split and delay unit 110 design illustrated in FIG. 1, $\Delta L=4an\sqrt{2}$, resulting in a required cube shaped prism that must have a wall or side as small as 1.23 mm. This may be too small to accommodate a collimated laser beam. However, for the same type of laser, the solution may be to use a larger optical path length difference $\Delta L$ and smaller wavelength separation $\Delta\lambda$, which may be achieved by adjusting the modulation amplitude for the DBR section. If switching between longitudinal modes is preferred, then a larger delay unit may still be achieved. For example, for m=2 in equation (1), the required cube should have a side three times larger than for m=1, or 3.68 mm.

Wavelength modulation of a laser 30 according to the present invention may be performed very fast, on a nanosecond scale. For the example of a DBR laser, either the DBR section or the phase section may be modulated at rates approaching and even exceeding 1 GHz. For example, when incorporating the present invention into an image projection system 100 having an XVGA image (1024×768 pixels) and a 60 Hz frame rate, the "pixel rate" is 47.2 MHz. Therefore, by applying the invention disclosed herein, the polarization state of the combined signal 120 can change several times during the time period that corresponds to the display time of a single pixel. As a result, the present invention may be combined with other methods for speckle contrast reduction that rely on averaging within the response time of the eye, but work at a slower rate, to achieve a compounded effect. As a further example, a position of the pixel on the screen 50 may be slightly altered between successive frames, producing a different speckle pattern. Since the eye is not fast enough to register an individual frame for a 60 Hz rate, speckle contrast will be reduced by $1/\sqrt{2*2*k}$, where factors of 2 are due to polarization scrambling (assuming depolarizing screen) and k is the number of different pixel positions projected. Assuming k=3, for example, the overall observed speckle contrast will be reduced to 29% of the original.

The present inventors have recognized that one method for creating very fast wavelength fluctuations consists of using laser diode chirping. When a laser diode is switched ON, the wavelength fluctuates at speed in the nanosecond scale due to fluctuations of the carrier density happening before the laser reaches its stationary state. Therefore, by continuously switching ON and OFF at periods of a few nanoseconds the wavelength of the laser constantly oscillates at frequencies higher than the pixel frequency.

It is noted that terms like "preferably," "commonly," "usually," and "typically," if utilized herein, should not be read to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention.

For the purposes of describing and defining the present invention it is noted that the term "approximately" is utilized herein to represent the inherent degree of uncertainty that may be attributed to any quantitative comparison, value, measurement, or other representation. The terms "approximately" is also utilized herein to represent the degree by which a quantitative representation may vary from a stated reference without resulting in a change in the basic function of the subject matter at issue.

It is noted that recitations herein of a component of the present invention being "programmed" in a particular way, "configured" or "programmed" to embody a particular property, or function in a particular manner, are structural recitations as opposed to recitations of intended use. More specifically, the references herein to the manner in which a component is "programmed" or "configured" denotes an existing physical condition of the component and, as such, is to be taken as a definite recitation of the structural characteristics of the component.

Having described the invention in detail and by reference to specific embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

The invention claimed is:

1. A method of operating a laser source wherein:
   the laser source comprises:
     a laser configured to generate an optical signal; and
     a polarization split and delay unit coupled to the optical signal configured to:
       split the optical signal into a first and second orthogonally polarized component;
       create an optical path length difference $\Delta L$ between the first and second orthogonally polarized components; and
       combine the first and second orthogonally polarized components into a combined signal; and
   the method comprises:
     modulating the optical signal by applying a wavelength modulation signal to the laser such that the modulated optical signal comprises at least a first wavelength $\lambda_1$ and a second wavelength $\lambda_2$, wherein the first wavelength $\lambda_1$ and the second wavelength $\lambda_2$ are separated by a wavelength difference $\Delta\lambda$; and
   wherein the wavelength difference $\Delta\lambda$ and the optical path length difference $\Delta L$ are such that the first component and the second component oscillate back and forth from an in-phase state, where the first and second components are approximately in phase, to an out of phase state, where the first and second components are approximately out of phase.

2. The method as claimed in claim 1 wherein
the first and second orthogonally polarized components have approximately equal power and polarization states orthogonal to each other; and
the polarization states comprise orthogonal linear polarization states or left and right hand circular polarization states.

3. The method as claimed in claim 1 wherein:
the laser comprises a semiconductor laser having a phase control section and a gain section; and
the wavelength modulation signal is applied to the phase control section of the laser.

4. The method as claimed in claim 1 wherein:
the laser comprises a semiconductor laser having a wavelength selective section and a gain section; and
the wavelength modulation signal is applied to the wavelength selective section of the laser.

5. The method as claimed in claim 1 wherein:
the laser comprises a semiconductor laser having a gain section; and
the wavelength modulation signal is applied to the gain section to reset the gain current of the semiconductor laser.

6. The method as claimed in claim 1 wherein the wavelength modulation signal is configured as an AC signal applied to the laser such that the optical signal alternates emission discretely at the first wavelength $\lambda_1$ and the second wavelength $\lambda_2$, or continuously traverses back and forth across the wavelength difference $\Delta\lambda$.

7. The method as claimed in claim 1 wherein the polarization split and delay unit comprises at least one polarizing beam splitter and a plurality of reflective surfaces.

8. The method as claimed in claim 7 wherein the first component is a s-polarized laser beam and the second component is a p-polarized laser beam.

9. The method as claimed in claim 7 wherein the first component is a p-polarized laser beam and the second component is a s-polarized laser beam.

10. The method as claimed in claim 7 wherein the plurality of reflective surfaces comprise a plurality of free-space mirrors located about the at least one polarizing beam splitter.

11. The method as claimed in claim 7 wherein:
the first component is reflected by the polarizing beam splitter and the second component is transmitted through the polarizing beam splitter; and
the second component is reflected by the plurality of reflective surfaces.

12. The method as claimed in claim 7 wherein:
the first component is reflected by the polarizing beam splitter and the second component is transmitted through the polarizing beam splitter; and
the first component is reflected by the plurality of reflective surfaces.

13. The method as claimed in claim 7 wherein the polarization split and delay unit comprises one or more beam splitting prisms having a plurality of prism walls as the plurality of reflective surfaces.

14. The method as claimed in claim 13 wherein the optical path length difference $\Delta L$ is defined by $kan\sqrt{2}$, where k is the number of reflective surfaces, a is the length of an individual one of the plurality of reflective surfaces and n is the refractive index of the polarization split and delay unit.

15. The method as claimed in claim 1 wherein:
the polarization split and delay unit comprises a beam splitter and a first quarter wave plate positioned in parallel with a second quarter wave plate;
the first component is reflected by the polarizing beam splitter toward the first quarter wave plate and the second component is transmitted through the polarizing beam splitter;
the first quarter wave plate switches the first component from a first polarization state to a second polarization state and reflects the first component toward the second quarter wave plate through the polarizing beam splitter;
the second quarter wave plate switches the first component from the second polarization state to the first polarization state and reflects the first component toward the polarizing beam splitter; and
the first component is reflected by the polarizing beam splitter and is combined with the second component.

16. The method as claimed in claim 1 wherein the wavelength difference $\Delta\lambda$ is selected such that:

$$\frac{\Delta L}{\lambda_1} = (2m-1)\frac{\lambda_1}{2\Delta\lambda}$$

where m is a positive integer and $\lambda_1$ is a wavelength of the optical signal.

17. The method as claimed in claim 1 wherein the combined signal alternates emission at two orthogonal states.

18. The method as claimed in claim 1 wherein the method further comprises coupling the combined signal to a depolarizing screen.

19. A laser projection system comprising a laser source, a laser driver and a system controller, wherein:
the laser source comprises:
a laser configured to generate an optical signal; and
a polarization split and delay unit coupled to the optical signal configured to:
split the optical signal into a first and second orthogonally polarized component;
create an optical path length difference $\Delta L$ between the first and second orthogonally polarized components; and
combine the first and second orthogonally polarized components into a combined signal; and
the system controller is programmed to instruct the laser driver to modulate the optical signal by applying a wavelength modulation signal to the laser such that the modulated optical signal comprises at least a first wavelength $\lambda_1$ and a second wavelength $\lambda_2$, wherein the first wavelength $\lambda_1$ and the second wavelength $\lambda_2$ are separated by a wavelength difference $\Delta\lambda$; and
wherein the wavelength difference $\Delta\lambda$ and the optical path difference $\Delta L$ are such that the first component and the second component oscillate back and forth from an in-phase state, where the first and second components are approximately in phase, to an out of phase state, where the first and second components are approximately out of phase.

20. The laser projection system as claimed in claim 19 wherein:
the system controller is programmed to generate optical emission of encoded image data by controlling at least one scanning mirror to scan the combined signal across a plurality of image pixels at an image pixel rate; and
the wavelength modulation signal has a frequency that is approximately greater than or equal to the image pixel rate.

21. The method as claimed in claim 19 wherein:
the system controller is programmed to generate optical emission of encoded image data by controlling at least one scanning mirror to scan the combined signal across a plurality of image pixels;
the plurality of image pixels are arranged to define an image frame that occurs at an image frame generation frequency; and
the wavelength modulation signal has a frequency that is at least one half of the frame generation frequency.

22. The laser projection system as claimed in claim 19 wherein:
the laser projection system further comprises a one dimensional polarization insensitive spatial light modulator that is controlled by the system controller to generate at least one line image at a line generation frequency;
the combined signal illuminates the one dimensional polarization insensitive spatial light modulator;
the system controller is programmed to control at least one scanning mirror to scan the at least one line image across a screen to generate a frame; and
the wavelength modulation signal has a frequency that is at least one half the line generation frequency.

23. The laser projection system as claimed in claim 19 wherein:
the laser projection system further comprises a two dimensional polarization insensitive spatial light modulator that is controlled by the system controller and comprises a plurality of pixels forming a gray-scale image;
the combined signal illuminates the two dimensional polarization insensitive spatial light modulator to generate a plurality of frames at a frame generation frequency; and
the wavelength modulation signal is synchronized with the frame generation frequency and has a frequency that is at least one half of the frame generation frequency.

24. The method as claimed in claim 19 wherein:
the laser projection system further comprises a two dimensional polarization sensitive spatial light modulator that is controlled by the system controller and comprises a plurality of pixels forming a gray-scale image;
the gray-scale image is inverted at the frame generation frequency;
the combined signal illuminates the two dimensional polarization sensitive spatial light modulator to generate a plurality of frames at a frame generation frequency; and the wavelength modulation signal has a frequency that is at least one half of the frame generation frequency, is synchronized with the frame generation frequency and is configured as an AC signal applied to the laser such that the optical signal alternates emission discretely at the first wavelength $\lambda_1$ and the second wavelength $\lambda_2$.

25. A method of operating laser source wherein:
the laser source comprises:
a laser configured to generate an optical signal; and
a polarization split and delay prism having a plurality of reflective surfaces and a polarization beam splitter coupled to the optical signal configured to:
split the optical signal into a first and second orthogonally polarized component;
create an optical path length difference $\Delta L$ between the first and second orthogonally polarized components, wherein the optical path length difference $\Delta L$ is defined by $kan\sqrt{2}$, where k is the number of reflective surfaces, a is the length of an individual one of the plurality of reflective surfaces and n is the refractive index of the polarization split and delay unit; and
combine the first and second orthogonally polarized components into a combined signal; and
the method comprises:
modulating the optical signal by applying a wavelength modulation signal to the laser such that the modulated optical signal comprises at least a first wavelength $\lambda_1$ and a second wavelength $\lambda_2$, wherein the first wavelength $\lambda_1$ and the second wavelength $\lambda_2$ are separated by a wavelength difference $\Delta\lambda$ such that:

$$\frac{\Delta L}{\lambda_1} = (2m-1)\frac{\lambda_1}{2\Delta\lambda},$$

where m is a positive integer and $\lambda_1$ is a wavelength of the optical signal; and
wherein the wavelength difference $\Delta\lambda$ and the optical path difference $\Delta L$ are such that the first component and the second component oscillate back and forth from an in-phase state, where the first and second components are approximately in phase, to an out of phase state, where the first and second components are approximately out of phase.

* * * * *